(12) United States Patent
Brankovic

(10) Patent No.: US 6,363,125 B1
(45) Date of Patent: Mar. 26, 2002

(54) NON-COHERENT SIX-PORT RECEIVER

(75) Inventor: Veselin Brankovic, Fellbach (DE)

(73) Assignee: Sony International (Europe) GmbH, Koln-Ossendorf (DE)

( * ) Notice: Subject to any disclaimer, the term of this patent is extended or adjusted under 35 U.S.C. 154(b) by 0 days.

(21) Appl. No.: 09/115,034

(22) Filed: Jul. 14, 1998

(30) Foreign Application Priority Data

Aug. 8, 1997 (EP) ............................................. 97113755

(51) Int. Cl.[7] .............................................. H04L 27/233
(52) U.S. Cl. ........................ 375/330; 375/283; 375/340
(58) Field of Search ................................ 375/254, 279, 375/316, 327, 340, 283, 308, 329, 330; 329/304; 324/637, 638

(56) References Cited

U.S. PATENT DOCUMENTS

| 4,104,583 A | * | 8/1978 | Engen ......................... 324/638 |
| 4,521,728 A | * | 6/1985 | Li ............................... 324/638 |
| 5,498,969 A | * | 3/1996 | Huyart et al. ................ 324/638 |
| 6,072,770 A | * | 6/2000 | Ho et al. ..................... 370/209 |

FOREIGN PATENT DOCUMENTS

| EP | 0 645 917 | | 3/1995 | |
| EP | 0 692 895 | | 1/1996 | |
| EP | 0 805 561 | | 11/1997 | |
| EP | 0841756 | * | 5/1998 | ............. H04B/1/30 |

OTHER PUBLICATIONS

Gerhard Schultes et al, "A Noew Incoherent Direct Conversion Receiver, " IEEE Vehicular Technology Conference 1990, pp. 668–674.*

Ji Li et al., "A new Direct Digital Receiver Performing Coherent PSK Reception, "Digest of IEEE MTT Symposium, vol. 3, pp. 1007–1010, May, 1995.*

Li, J. Et Al: "A Six–Port Direct Digital Millimeter Wave Receiver" IEEE MTT–S International Microwave Symposium Digest, San Diego, May 23–27, 1994, vol. 3, May 23, 1994, Kuno H. J.;Wen C. P. (Editors), pp. 1659–1662, XP000512814.

* cited by examiner

Primary Examiner—Stephen Chin
Assistant Examiner—Chieh M. Fan
(74) Attorney, Agent, or Firm—Frommer Lawrence & Haug LLP; William S. Frommer; Dexter T. Chang

(57) ABSTRACT

According to the present invention a method and a receiver for high-frequency signals is provided. The receiver comprises a power divider (4) to divide a modulated RF input signal in at least two branches. At least one delay line (5, 6) provides for a delay of the branches relatively to each other by a predetermined delay constant. A calculation circuit (7, 8) calculates at least three power levels based on combinations (12, 13, 14) of the two branches of the input signal relatively delayed (5, 6) to each other. A processing means (10) calculates the phase and the amplitude of a complex signal representing the relation between the two branches of the input signal relatively delayed to each other, on the basis of the said at least three power levels (8).

The invention therefore provides for a direct 6-port receiver based on non-coherent detection. The concept of the invention is inherently cheap and features high integration ability and low-cost processes. Ideally the whole RF front end can be placed on one chip.

21 Claims, 6 Drawing Sheets

NON-COHERENT SIX-PORT RECEIVER

BACKGROUND OF THE INVENTION

1. Field of the Invention

The present invention relates to a method and a receiver for receiving and demodulating a high frequency signal by direct conversion. The present application is furthermore directed on a mobile communication device and a cellular telephone comprising such a receiver.

2. Description of the Related Art

Recently it has been shown that a so-called 6-port receiving circuit in conjunction with a digital signal processor is capable of performing digital demodulation directly at frequencies ranging from microwave to mm-wave bands. This new direct digital receiver promises reduced receiver complexity, low fabrication requirements and fair performance in providing a cost-effective alternative to the conventional heterodyne structure used in various digital terminals.

The most widely used modulation schemes in digital communication systems, such as satellite and personal communication systems, are PSK (phase shift keying). There are two types of demodulation techniques: Coherent and non-coherent (differential). In general, the differential detection brings about less complicated receiver configuration whereas the coherent detection is superior in error performance. However, the complexity of a coherent receiver may be increased significantly due to the carrier recovery requirement. This task becomes particularly difficult when the carrier recovery has to be performed directly at microwave and mm-wave frequencies.

FIG. 3b shows schematically the application area of a direct six-port receiver as a partial or complete replacement of a conventional heterodyne receiver structure (FIG. 3a).

FIG. 4 shows the structure of a 6-port receiver known from Bossisio, Wu "A six-port direct digital millimeter wave receiver", Digest of 1994 IEEE MTT Symposium, vol. 3, page 1659–1662, San Diego, May 1994.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at at least three and particularly four of the six ports. The imperfections of the hardware can be readily eliminated by an appropriate calibration procedure. Very accurate measurements can be made of a large dynamic range and wide frequency range. 6-port junction receivers consist of passive microwave components such as directional couplers and power dividers as well as diode detectors. The circuit can be easily integrated as MHMIC or MMIC. The known receiver performs direct phase/amplitude demodulation at microwave and mm-wave frequencies. The traditional I-Q block in a receiver is replaced by a 6-port phase/frequency discriminator which contains a 6-port receiver and a digital signal processing (DSP) unit. The incoming digitally modulated RF-signal is compared with the output of a digital controlled local oscillator 18. Carrier recovery is first performed. The DSP-unit 17 detects the frequency difference of the signals and then controls the local oscillator 18 to track the incoming signal. Once the carrier is recovered the instantaneous phase of the received signal is detected and decoded so as to recover the original modulated data. The maximum data transmission rate is determined mainly by the sampling rate of the A/D-converters 16 and the processing speed of the DSP-unit 17.

By performing a calibration procedure the hardware imperfections such as phase error of the bridges, imbalance of the power detectors, etc. can be readily eliminated. This significantly eases the requirement of the hardware implementation and enables the 6-port receiver to operate over wide band up to mm-wave frequencies. In a 6-port receiver the magnitude in phase are acquired independently. Therefore, the phase modulation of the incoming signal can still be detected correctly even though the amplitude of the incoming signal changes over a large dynamic range. Switching between different modulations can be readily accomplished by slight alternations of the algorithm in the DSP-unit 17.

A receiver as shown in FIG. 4 is called a coherent receiver. However, there is the problem that the known 6-port receiver is quite complicated and particularly cannot be integrated on one chip because of the existence of the local oscillator 18.

OBJECT OF THE INVENTION

It is therefore the object of the present invention to provide a method and a receiver for receiving and demodulating a high frequency signal by direct conversion with a simplified structure and with less costs.

The central idea of the present invention thereby is to replace the coherent receiver by a non-coherent detection receiver.

SUMMARY OF THE INVENTION

According to the invention a method is provided for receiving a high frequency signal by direct conversion. A digitally modulated input signal is divided in at least two branches. One of the branches is delayed relatively to the other one of the branches by a predetermined delay constant. At least three power levels and preferably four power levels are calculated based on combinations of the two branches of the input signal relatively delayed to each other. Then the phase and the amplitude of a complex signal is calculated, said complex signal representing the relation (ratio) between the two branches of the input signal relatively delayed to each other, on the basis of their three or four power levels.

Both branches of the input signal can be delayed, wherein the delay constant of the two branches is different.

The at least three power levels can be A/D-converted and the phase on the amplitude of the complex signal can be calculated by digital processing.

The relative delay between the two branches of the input signal can be equal or greater than the inverse of the sampling rate of the A/D-conversion.

The modulated input signal can be differentially PSK modulated and the complex signal can be calculated on the basis of the at least three analog power levels.

The calculation of the at least three power levels can be affected by means only of linear passive components, such as detection diodes.

The step of calculating the phase and the amplitude of the complex signal can furthermore comprise the step of calculating calibration coefficients.

The step of calculating the phase and the amplitude of the complex signal can furthermore comprise the transformation of the complex signal in real (I) and imaginary (Q) parts.

According to the present invention furthermore a receiver for demodulating a high frequency signal by direct conversion is provided. The receiver comprises a power divider to divide a modulated input signal in at least two branches. At least one delay line is provided for delaying one of the branches relatively to each other by a predetermined constant. A calculating circuit calculates at least three power levels based on e.g. linear combinations of the two branches of the input signal which are delayed relatively to each other by a predetermined delay constant. A processing means calculates the phase and the amplitude of a complex signal representing the relation (ratio) between the two branches of the input signal relatively delayed to each other, on the basis of the said at least three power levels.

Two delay lines can be provided for delaying respectively one of the branches of the input signal, the two delay lines having different delay constants.

A/D-converters can be provided for converting the at least three power level's output by the calculating circuit. In that case the processing means can be a digital processing means.

The delay between the two branches of the input signal can be set equal or greater than the inverse of the sampling rate of the A/D-converters.

The modulated input signal can be a differentially PSK modulated signal and in that case the processing means can be analog processing means.

The calculation circuit can comprise only linear passive components.

The delay line and the calculating circuit can be integrated on one chip, as there is no longer any need for a local oscillator.

A digital filter can be provided between an A/D-converter and a processing means respectively.

According to the invention furthermore a mobile communication device comprising a receiver as set out above is provided, which mobile communication device can be a cellular telephone. Further preferred applications are satellite receiver or receiver for microwave distribution systems.

BRIEF DESCRIPTION OF THE DRAWINGS

Preferred embodiments of the invention will now be explained referring to the figures of the annexed drawings:

in FIG. 7 or FIG. 8.

DETAILED DESCRIPTION OF PREFERRED EMBODIMENTS

The present invention has been accomplished based on the following motivation issues:

The invention provides for a direct conversion (homodyne) system which can also function in the direct conversion of mm-wave and to base band conversion, the front end can be realized with passive components which are not ideal due to fabrication tolerances, the invention inherently avoids classic I/Q-circuits and therefore their amplitude/phase imbalance, the invention allows to utilize extremely low power levels of a RF local oscillator, the hardware of the receiver copes with many possible different modulation techniques with different base band channel band widths, the invention provides an inherently cheap concept which features high integration ability and low cost process. Ideally the whole RF front end is placed on one chip, the receiver supports global policy to reduce analog processing towards digital processing, the invention supports the general developments towards software radio and the invention allows high data rate applications (also greater than 2 Mbits/sec).

The invention will now be explained referencing to FIG. 1.

Figure 1:
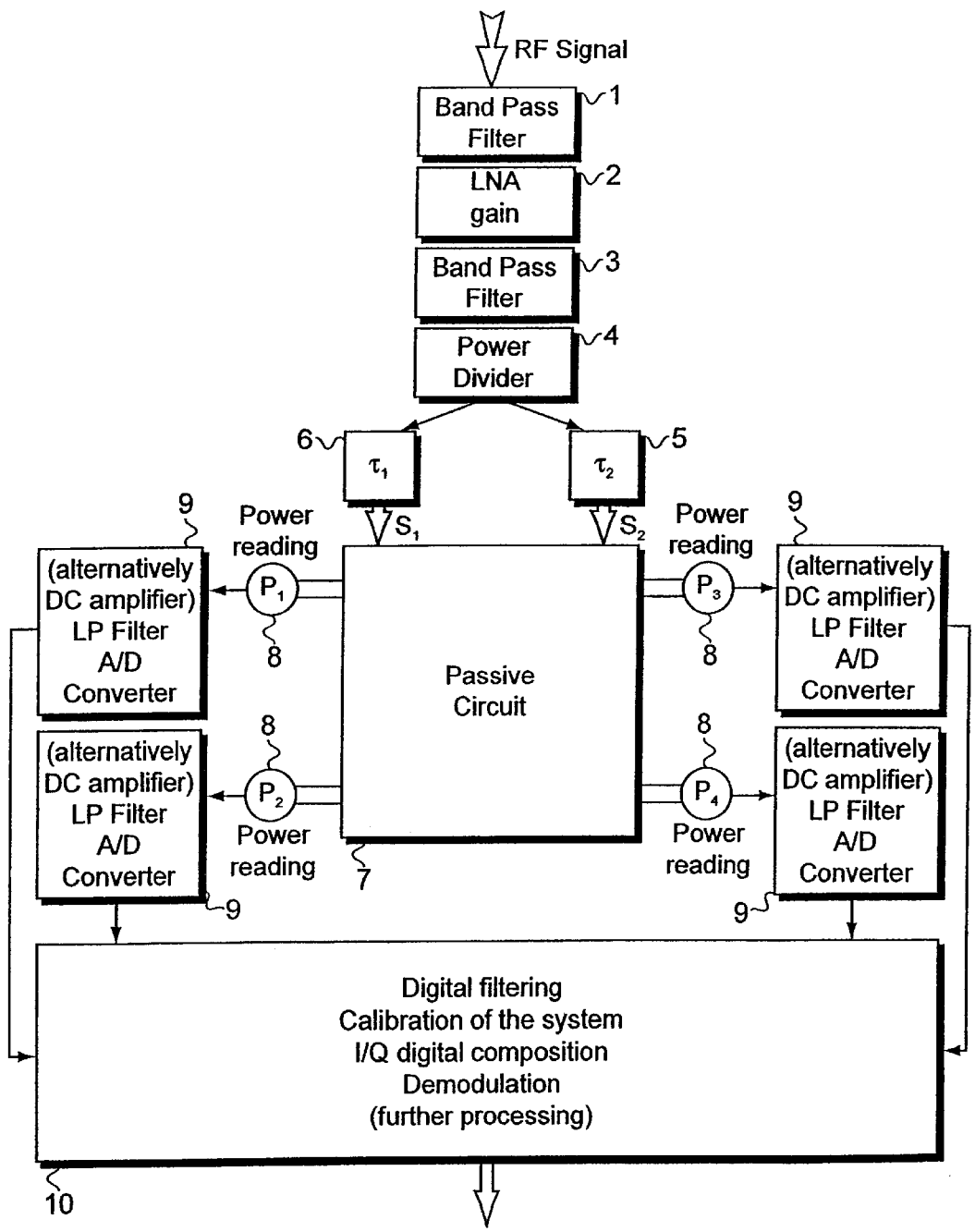
FIG. 1 schematically shows a receiver according to the present invention.

FIG. 1 shows the general concept of a direct 6-port receiver based on non-coherent detection according to the present invention. As can be seen from FIG. 1 a received RF-signal is passed through a band pass filter 1, LNA-amplified 2, again passed through another band pass filter 3 and then output to a power divider 4. The power divider 4 divides the supplied RF-signal in two branches S1 and S2. One branch S1 is output to a first delay line 6 with a delay constant τ1. The other branch's output to a second delay line 5 with a delay constant τ2 which is different to the delay constant τ1 of the first delay line 6. The two branches S1, S2 divided by the power divider 4 and delayed by the first 6 and second delay line 5 are then input to a passive circuit 7. The passive circuit 7 provides for different linear combinations of the two input signals. The passive circuit 7 preferably only comprises linear passive components such as detector diodes.

The amplitude, i.e. the power of the at least three linear combinations calculated by the passive circuit 7 and preferably the four linear combinations provided by the passive circuit 7 are then detected by power reading circuits 8. The power reading circuits 8 preferably comprise only detector diodes. As it has already been stated, the minimum number of detected power levels detected by the power reading circuits 8 is three. In the example shown in FIG. 1 the passive circuit 7 provides for 4 linear combinations of the two input signals S1 and S2, and therefore four power levels are detected on the four linear combinations. The example of FIG. 1 therefore provides for a certain redundancy of the entire system.

The output of the power reading circuits 8, i.e. the detected power levels are then respectively given to circuits 9, which comprise low pass filters and A/D converters. Alternatively, the circuitry 9 can comprise DC amplifiers. Therefore the circuitry 9 respectively amplifies the detected power level output by the power reading circuits 8 and converts them digitally. The digital output signals of the circuitry 9 are then respectively given to a digital signal processing unit 10. The digital signal processing unit 10 provides for a digital filtering of the input signals, a calibration of the system, which will be explained afterwards, the calculation of the I/Q parts of the input signals as well as a further processing such as a demodulation.

As can be seen from FIG. 1 according to the invention the direct 6-port receiver essentially consists of two inputs (RF-band) approaching a passive RF structure. Passive RF structure is defined as a passive circuitry, designed to function in frequency bands beginning of tenths of MHz up to tenths of GHz depending on different realization issues. The passive structure contains several (at least three, preferably four) power detectors. The outputs of the power detectors 8 are DC voltages which are sampled by the A/D converter 9 after a possible amplification (optionally) and filtering.

An important feature of the invention is the provision of the two delay lines 5, 6 to suppress the local oscillator of the state of the art. The two delay lines 5, 6 provide for a relative delay between the two branches divided by the power divider 4 of the RF signal, the relative delay of which is $\tau=\tau_1-\tau_2$. As it is only important to provide for a relative delay between the two branches divided by the power divider 4, $\tau_2$ can be 0 and the corresponding delay line 6 can be suppressed. The relative delay $\tau$ between the two branches divided by the power divider 4 is equal or greater than the inverse of the sampling rate of the A/D converter 9.

As can be seen from FIG. 1 the invention allows a detection of vector information, i.e. a phase on the amplitude of the RF signal based only on scalar information (power levels detected by the power reading circuits 8). Therefore the invention allows for a detection of a phase information non-coherently. The method how the vector information representing the relation (ratio) between the two branches of the input signal which are delayed relatively to each other (delay lines 5, 6) in the digital signal processing unit 10 will be explained later on.

The advantages of the inventive system over classic approaches are that hardware imperfections (phase and amplitude imbalances) are inherently avoided by a calibration procedure which can be performed without changing physical connections, which allows usage of the RF components without having large requirements on the components' tolerances. Furthermore there is no need to have a local oscillator (LO), as a non-coherent demodulation is used. Otherwise a local oscillator with low power (similar to RF level) is required an AFC (automatic frequency (phase) controlling) digital processing unit is required.

An advantage of the invention is that the whole RF front end can be realized with a simple chip if there is no local oscillator. Conventional, not necessarily very advanced GAAS or (SI) MMIC technology for lower frequency bands could be utilized for much higher frequency bands 6-port structure, as there are no active components and the main challenge is only to realize detector diodes on a waver. Therefore the invention provides for a cost reduction in the RF-front end due to avoiding the intermediate stages and having less complicated RF-front end structure (without local oscillator circuit, AGC and PLL).

In the example shown in FIG. 1 the detected power levels are A/D converted 9 and then digitally processed. However, in the case the input RF signal is modulated in a simple way, the detected analog power levels have not to be A/D converted and can be processed in an analog way.

In any case, in the calculation block provided by the digital signal processing unit 10 an complex signal representing a ratio of the two input RF-signals provided by the power divider 4 is calculating using additional calibration coefficients obtained from a calibration procedure. The complex signal can then be further optionally decomposed to I/Q data streams to be further used for a conventional demodulation procedure in a base band.

Optionally additional LNA and additional BPF can be placed after the delay lines 5, 6 or integrated within the delay lines 5, 6 before approaching the inputs of the passive circuitry structure 7.

Now the elements constituting the inventive receiving method and inventive receiver will be explained in a more detailed way:

The passive RF circuit 7 is a circuit including only passive linear components, this can include power dividers, hybrids, couplers, transmission lines, matching elements, resistors, capacitors in a different number of each art of component and compositions. A whole passage circuitry can be realized with distributed or lump elements. The design of the transmission lines, substrates or re-used lump elements is arbitrary and is usually set to optimize the passive circuit 7 to defined bands of interest, which are called RF frequency bands in the following explanation.

Figure 3:
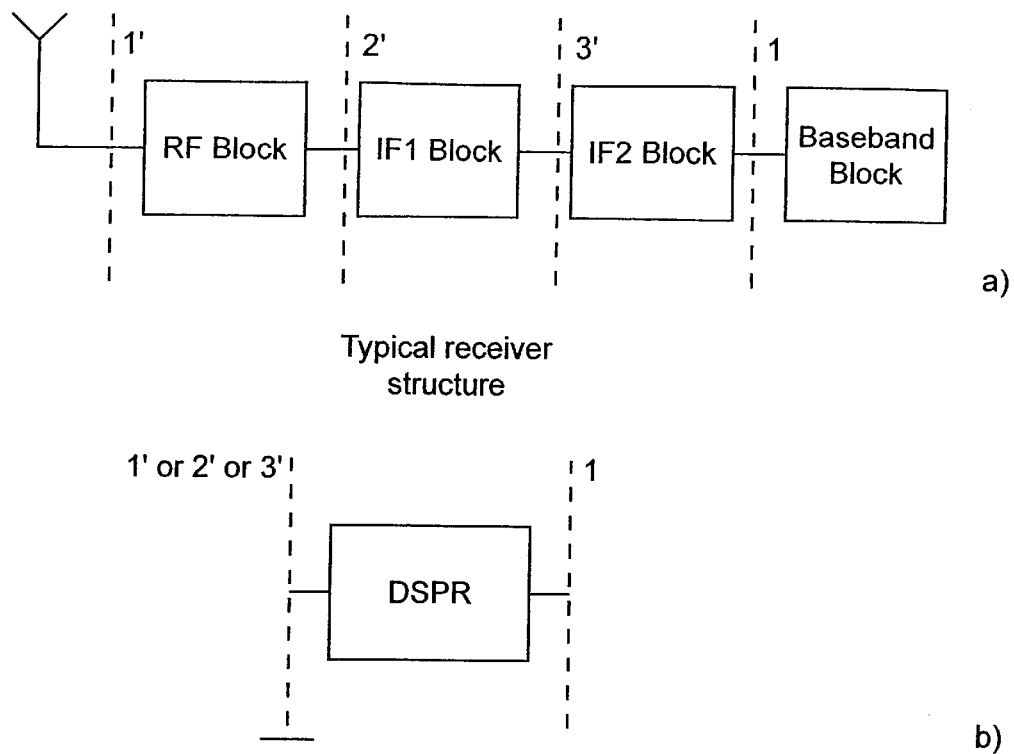
FIG. 3 shows the partial or complete replacement of a heterodyne receiver (FIG. 3a) by a direct 6-port receiver (FIG. 3b)
Figure 4:
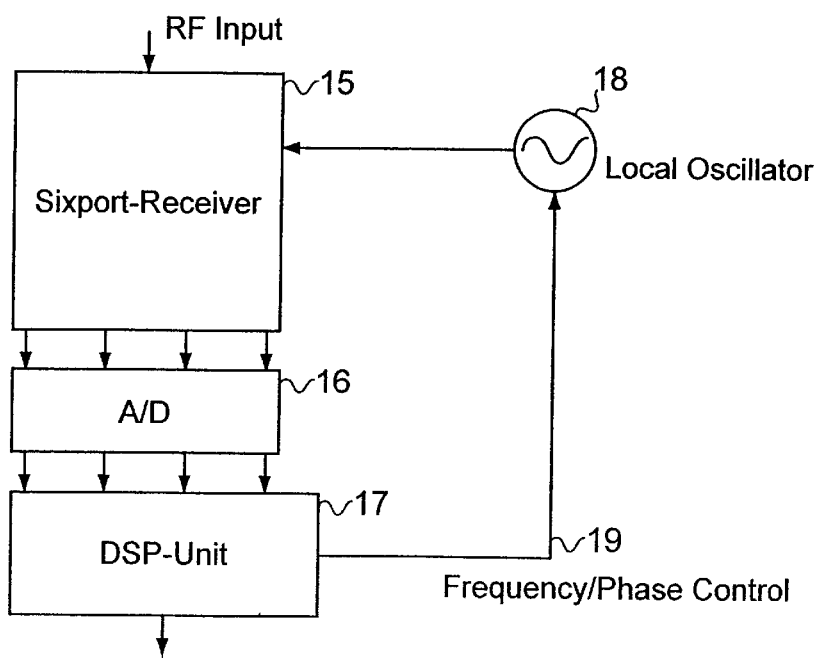
FIG. 4 shows a coherent 6-port receiver according to the state of the art.

The RF frequency band is a band of interest. The RF frequency band represents a frequency band in which the proposed receiver structure functions. RF frequency band can also be understood as an intermediate frequency band of a more complex receiver circuitry. In that case, the proposed receiver functions as a direct conversion circuitry from intermediate frequency to the base band. As it is shown in FIG. 3a and FIG. 3b, the direct 6-port-receiver according to the present invention can process in that case the intermediate frequency signal obtained from another intermediate frequency or higher RF frequency signal by one of the classic down-conversion techniques. The RF frequency signal can take frequency values in the range of 50 MHz to 100 GHz. The RF frequency signal is filtered and amplified before approaching the passive circuit 7. Before the first band pass filtering 1 additional structures can be utilized to provide frequency channel assignment if necessary.

As it has already been stated above, the passive circuit 7 provides for at least three and preferably four linear combinations of the two input signals $S_1$ and $S_2$ output by the delay lines 6 and 5, respectively. Said four power levels $P_1$, $P_2$, $P_3$ and $P_4$ are calculated based on the two input signals $S_1$, $S_2$ according to the following equation 1:

$$P_1 = a \times S_1 + b \times S_2$$
$$P_2 = c \times S_1 + d \times S_2$$
$$P_3 = e \times S_1 + f \times S_2$$
$$P_4 = g \times S_1 + h \times S_2$$

The power levels $P_1$, $P_2$, $P_3$ and $P_4$ are detected by the power reading circuits (power detectors) 8. A power detector is a device which converts power of the signals coming in the frequency range of the RF frequency band to a DC voltage information. It can be realized in different technologies. The most usual technology for the practical implementation and realization of the digital 6-point receiver is the realization with common detector diode approach. Detector diodes can be integrated on one chip together with the passive circuit 7. Detector diodes is to be understood as detector diodes with an optional circuitry for temperature compensation.

The digital signal processing unit 10 calculates a complex signal out of the amplified, filtered and A/D-converted power levels $P_1$, $P_2$, $P_3$ and $P_4$, which complex signal represents the relation (ratio) between the two input signals $S_1$, and $S_2$. The digital signal processing unit 10 is a hardware which allows digital signal processing of the bits coming from the A/D converter 9. The basic functions of digital signal processing unit 10 are:

digital low pass filtering, calculation of the mentioned complex signal, calculation of the calibration coefficients obtained from a calibration procedure and transformation of the complex signal to the real and imaginary parts (I/Q-output) if required.

The calculation of the complex signal as well as the calculation of the calibration coefficients is done using alternatively software digital signal processing capabilities or hardware capabilities (ASIC or similar). This depends on the considered data rates to be processed. The processing done by the digital signal processing unit 10 can be realized in conjunction with a demodulation procedure using the same hardware parts (e.g. the same digital signal processing).

In the following it will now be explained how the digital signal processing unit 10 calculates the mentioned complex signal representing the ratio between the two input signal S1 and S2. The complex signal is a signal which is calculated in the digital signal processing unit 10 using calibration coefficients and combinations of relative power levels, which are detected by the power reading circuits 8 and presented as ratios of voltages. The typical structure of the complex signal with the usual number of power reading circuits 8 (4) is presented in the following equation 2:

$$\rho_a = |a|e^{j\varphi} = \frac{\sum_{i=1}^{3}(x(i)+jy(i))p_i}{\sum_{i=1}^{3}(x_1(i)+jy_1(i))p_i} = \frac{\rho_s(\tau_1)}{\rho_s(\tau_2)} = \left|\frac{\rho_s(\tau_1)}{\rho_s(\tau_2)}\right| e^{j(2\pi(f(\tau_1)-f(\tau_2))\Delta\tau+\theta(\tau_1)-\theta(\tau_2))}$$

wherein $p_i$ is the relative power detected by the power reading circuits 8 expressed in voltage divided by a reference power detection (usually the forth power reading, e.g. $p_1=P_1/P_4$), x (i), $x_1$(i), y(i), $y_1$(i), i=1, 2, 3 are calibration coefficients obtained by a calibration procedure, $P_s(\tau_1)$ is the input signal S1 delayed by $\tau_1$ which actually consists of a base band signal up-converted to the carrier frequency $f_0$, $P_s(\tau_2)$ is the input signal delayed by $\tau_2$ by the second delay line 5, the input signal of which is $S_2$ and actually consists of a baseband signal up-converted to the carrier frequency $f_0$, and $\Delta\tau=\tau_1-\tau_2$, it is to be noted that $\Delta\tau$ is greater or equal to the sampling period of the A/D converter 9, that also one of the delay constants can be 0.

It can be seen that in the case that the change of the total frequency content in the two samples of the signal multiplied with the difference in the time delay is constant or if it could be neglected, one can obtain information about the relative change in the amplitude and phase from one sample to the other, or the relative increment or decrement of the I/Q signals.

The detection of this value it particularly correct in the case when the oscillating period of the main carrier is much more smaller than the sampling period (so that a virtually quasi steady state is obtained in the passive circuit 7 and the power detection by the power reading circuits 8 can be performed.

The calibration procedure is a procedure which is necessary in order to obtain calibration coefficients xi, y(i). The calibration can be done without disconnecting the physical connections of the system. The calibration procedure which can be performed in an off-line approach. The system parameters do not alter fast, so that off-line calculations can be performed in the period T. The period T is much larger than the signal symbol duration.

The calibration coefficients are obtained by the calibration process and they are used for relative signal detection in conjunction with power reading. In the very first minute before updating with data from calibration procedure values from a memory, initial calibration values are utilized for the calculation of a relative signal.

After performing the non-coherent detection of the I/Q mathematically calculated values in the digital signal processing unit 10, a demodulation procedure is executed. The demodulation procedure can be performed by the hardware structures (e.g. I/Q demodulator chips) or with the DSP software (e.g. the same DSP which is used for calculation of the calibration coefficients and for calculation of the complex signal). It is to be noted that for some applications the complex signal can be directly utilized for the demodulation without its decomposition in the I- or Q-information (data stream). Due to the inherently proposed non-coherent detection it is necessary to apply a differential processing of the data streams before approaching D/A converters and further I/Q ports of the transmitter modulator.

In the following an example for the function of the invention will be explained referencing to FIG. 2 and FIGS. 5–9.

In the following explanation a differential QPSK modulated signal is assumed and demodulated. Additional assumptions are invariant to the system concept and they are utilized only for the simplified demonstration and explanation of the system.

It is to be noted that the kind of modulation use does not alter the principal functionality of the proposed receiver, so that all kinds of combinations of modulation schemes can be utilized if they are processed differentially before approaching D/A converters and I/Q ports of the transceiver. It is furthermore to be noted that the structure of the passive circuit 7 is invariant.

Figure 2:
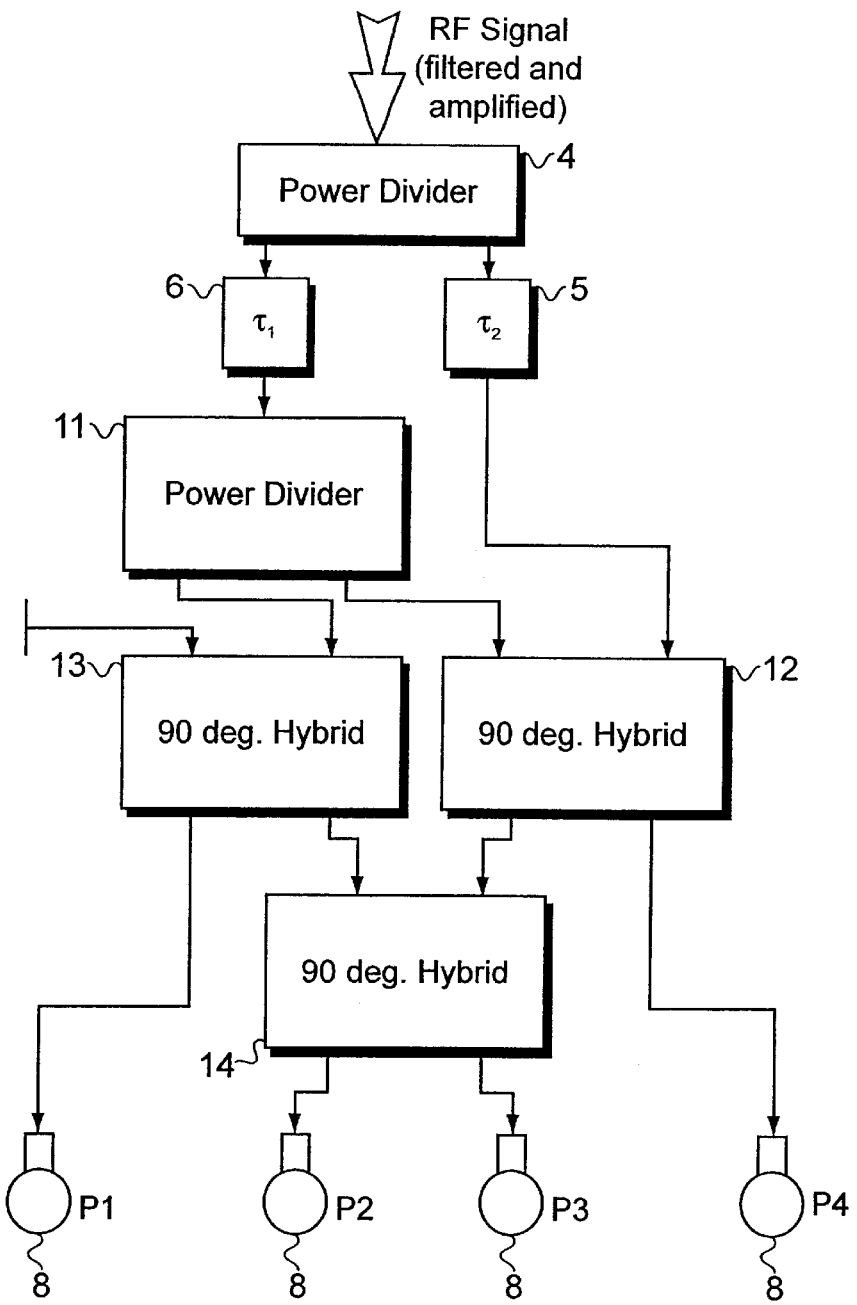
FIG. 2 shows the passive circuitry of the receiver in a detailed way according to FIG. 1.

In the following explanation it is assumed that the delay difference equals to the sampling period. Furthermore it is assumed that the RF frequency signals have the same power level as that which is supplied to the passive circuit 7. The incoming RF signal is differentially modulated and sent by the transmitter. The passive circuit 7 consists of ideal sub-circuits which need not to be calibrated. Furthermore ideal linear power reading circuits (power detectors) 8 are considered. The passive structure can be as shown in FIG. 2.

In the following table the resultant power readings normalized over power reading from the power detector P1 are presented for a set of differential phase differences in the case of a constant signal amplitude (ideal detection).

| Relative phase difference ang(s)(t)) − ang(s(t-τ)) | P4/P1 | P3/P1 | P2/P1 | Decision logic tolerances for P4/P1 | Decision logic tolerances for P3/P1 | Decision logic tolerances for P2/P1 |
| --- | --- | --- | --- | --- | --- | --- |
| 0 | 3 | 3.414 | 0.5857 | 1 to 5 | 2 to 4 | 0 to 2 |
| π/2 | 5.8258 | 0.585 | 0.585 | 5 to 0.825 | 0 to 2 | 0 to 2 |
| π | 3 | 0.585 | 3.414 | 1 to 5 | 0 to 2 | 2 to 4 |
| 3π/2 | 0 | 3.414 | 3.414 | 1 to 1.17 | 2 to 4 | 2 to 4 |

Figure 5:
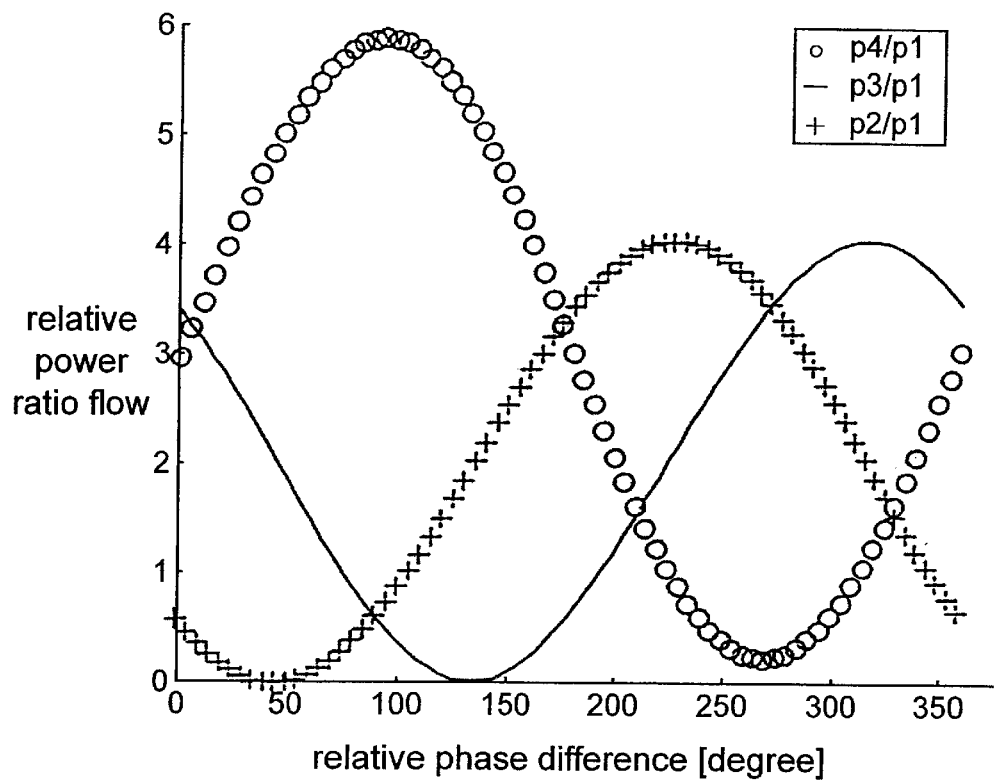
FIG. 5 shows the relation between relative power ratios detected by the 6-port receiver according to the present invention and the relative phase difference of a divided digital modulated input signal.

FIG. 5 shows the variation of the relative power levels (voltage at power detectors) as a function of the relative phase difference. In FIG. 5 it is assumed that there is no amplitude variation between time samples and both incoming signals S1, S2 have the same power level.

Figure 6:
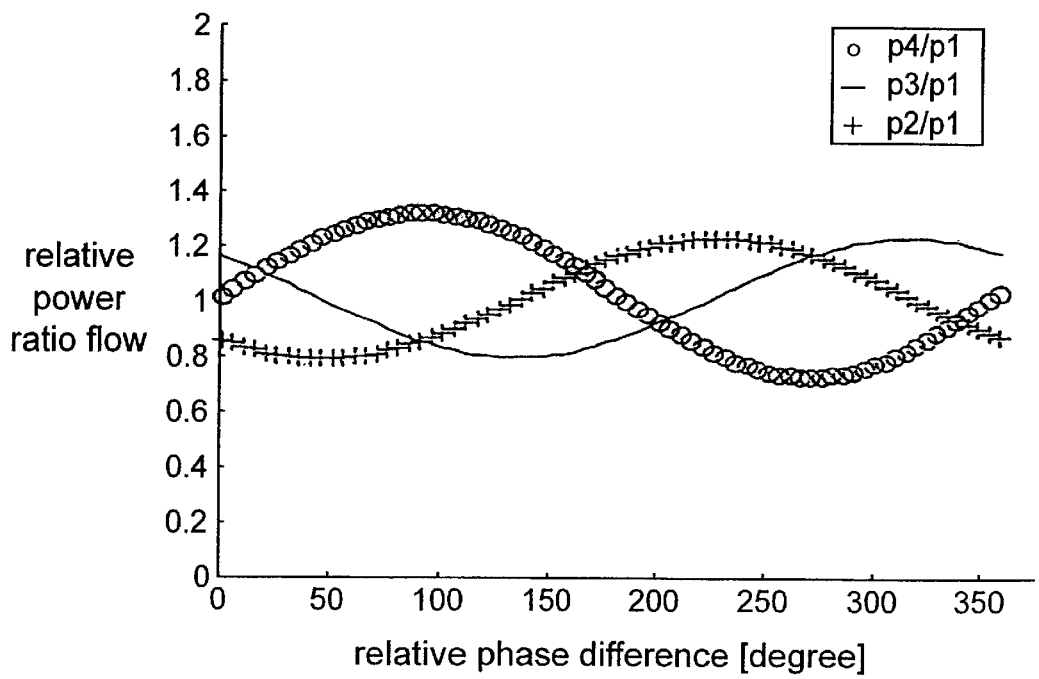
FIG. 6 is a graphic representation similar to FIG. 5, but in the case that the incoming signals have relative power level difference of 20 dB.

FIG. 6 is a representation similar to FIG. 5, but with the assumption that the incoming signals have a relative power level difference of 20 dB.

From FIGS. 5 and 6 it can be concluded that the sensitivity of the system decreases if the power level difference of the incoming signal S1, S2 increases. This situation can occur, if only one delay line 5, 6 is used in the system configuration, so that one of the incoming signals S1, S2 is also attenuated relatively to the other one which is not delayed.

It is to be noted that the relative power levels are independent of the RF signal level.

Furthermore it is to be noted that, if the number of phase (or amplitude) states is low, there is no need in some cases for a calculation of the relative signal amplitude and phases because a simple decision logic can be established based on a comparison of the analog voltages (power levels) using analog devices to perform a demodulation. This is for example true for a (D)PSK modulation.

Figure 7:
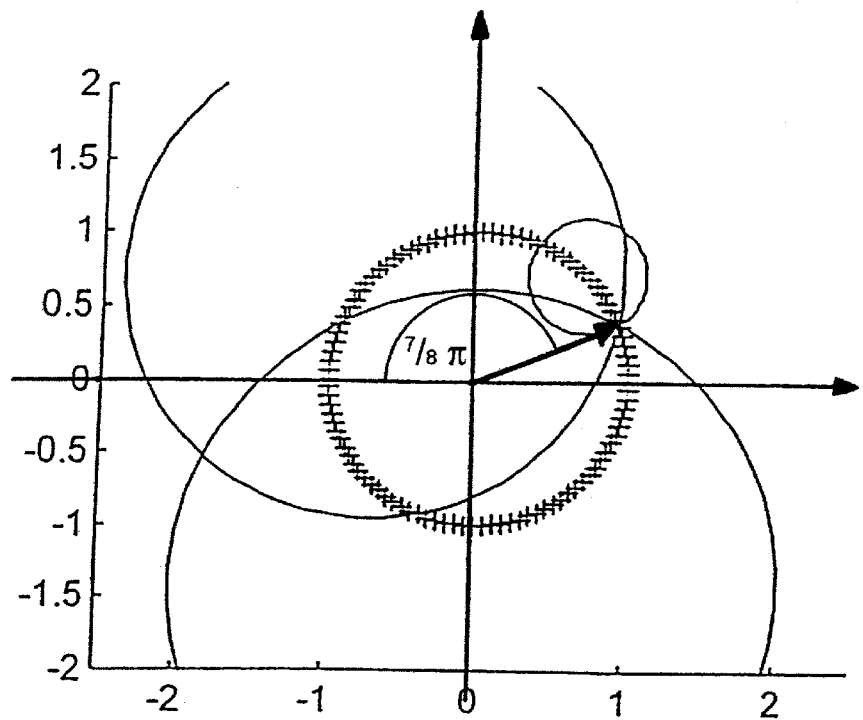
FIG. 7 shows an example of the calculation procedure required to obtain a phase change and the amplitude of the signal, wherein the phase change takes the value of 157.5° ($7\pi/8$), the magnitude remaining the same.

FIG. 7 shows a principle calculation required to be performed in the digital signal processing unit 10 of the receiver. FIG. 7 shows as an example the state that the two signals S1, S2 have the same magnitude in two different time points (QPSK modulation) and the phase difference is 7π/8 by detecting and calculating the measured power levels and the calibration coefficients as shown three circles are obtained. Ideally they cross in one point. When the crossing point is connected to the center of the grid, the thus created vector represents the complex ratio of the signals S1, S2 at two different time increments, which time increment is defined by the relative delay provided by the two delay lines 5, 6. To obtain the complex value a mathematical processing is required to calculate the crossing point of the known circles (the circles are defined by the calibration coefficients).

As can be seen from FIG. 7, the vector directing from the origin of the grid to the crossing point of the three circles has a length (amplitude) corresponding to one unit and represents an angle of 157.5° (7π/8). The fact that the vector has the length corresponding to one unit represents the fact, that the two signals S1, S2 have the same magnitude, as it is the case e.g. for the QPSK modulation.

Figure 8:
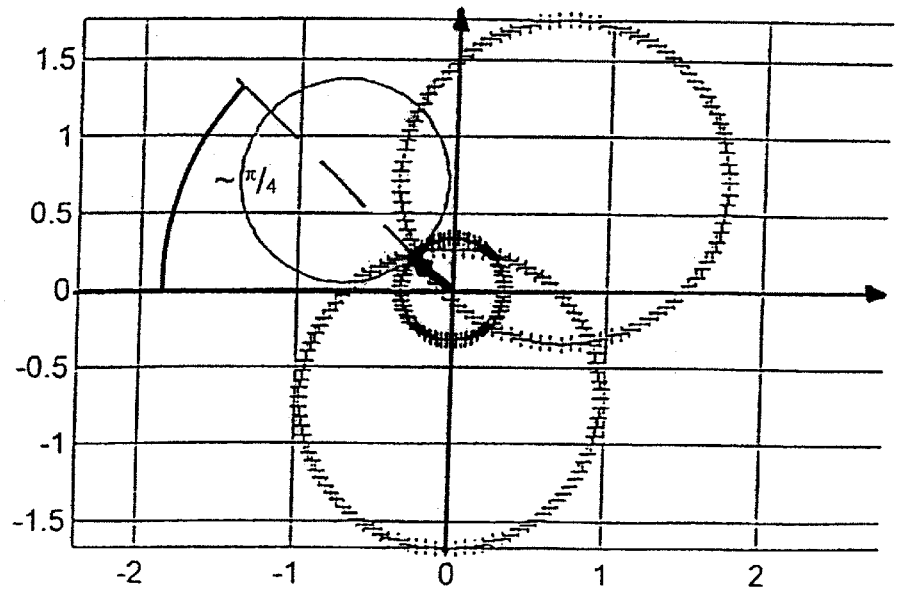
FIG. 8 shows an example in the case that the relative change of the incoming signal is three times in the magnitude and 45.5° ($\pi/4$) in phase.
Figure 9:
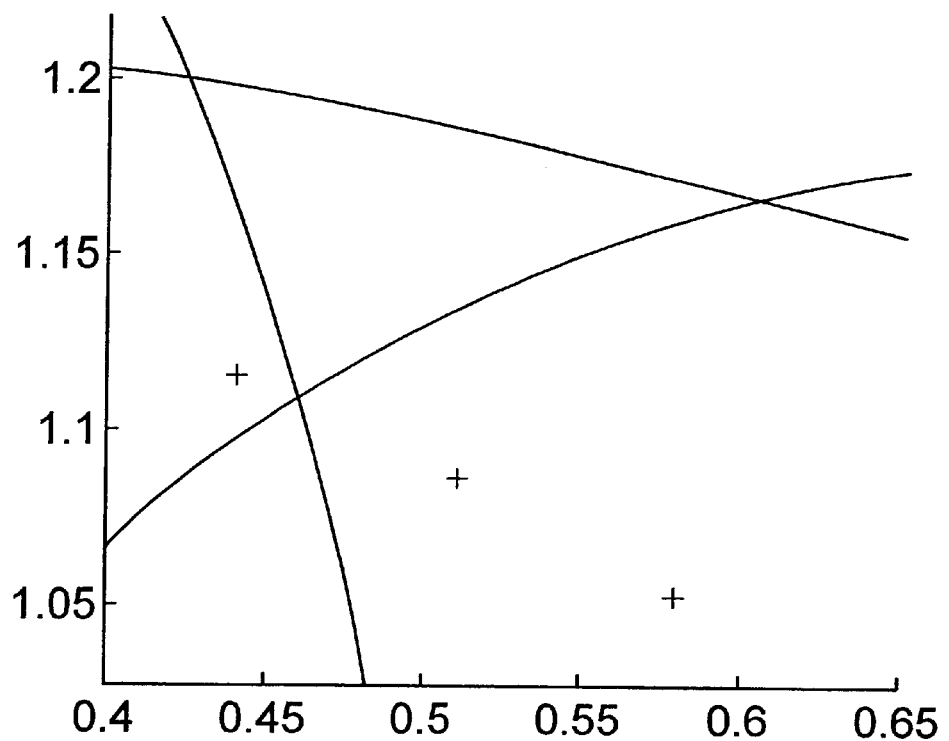
FIG. 9 shows the mathematical corrections to match the possible offset in the circle's crossings as e.g.

FIG. 8 shows the case, that the two signals S1, S2 are different in phase and magnitude. FIG. 8 shows as an example the state that the relative change of the signal is three times in the magnitude and 45.5° (π7/4) in phase. As can be seen from FIG. 8, the vector direction from the origin of the grid to the crossing point of the three circles has a length corresponding to 1/3 units and an angle of 45.5° (π/4).

It is to be noted that the results of the calculation generally are not the final complex value of this signal. The direct 6-port receiver detects differences between the two signals S1, S2, so that any relative change in signal from one to another time step can be detected. That means that before the transmission of the up-converted signal, the digital data before supplied to the transmitter I/Q modulator via D/A converter have to be differentially processed which is inherently true for DPSK modulation schemes. In case the transmitted digital data are not differentially modulated, reference samples have to be sent in order to provide a reference magnitude and a reference phase for the detection of the absolute values of the modulated digital data.

In real, i.e. not ideal circuits the three circles do not cross exactly in the same point. Therefore there is usually some offset in the circles' crossings, which has to be mathematically treated. The offset is due to the fact that the calibration coefficients are not optimally obtained. A further reason for the offset can be different noise effects. Different approaches can be utilized in the signal processing of the digital signal processing unit 10 to "decide" where to place a crossing point. For example the geometric median of the curved triangle can be taken as the crossing point. However, the offset can be neglected in some cases, where a relative low number of the modulation states are considered, as it is the case e.g. for a QPSK modulation scheme.

What is claimed is:

1. A method for receiving a high frequency signal, comprising the steps of:
   dividing a high frequency input signal in at least two branches;
   delaying the at least two branches of the divided input signal relative to one another by a predetermined delay constant;
   calculating at least three power levels based on combinations of the delayed at least two branches of the divided input signal; and
   calculating a phase and an amplitude of a complex signal representing a relationship between the delayed at least two branches of the divided input signal based on said at least three power levels.

2. A method according to claim 1,
   wherein the at least three power levels are A/D-converted, and
   wherein the phase and the amplitude of the complex signal is calculated by digital processing.

3. A method according to claim 2, wherein a relative delay between the delayed at least two branches of the divided input signal is equal or greater than an inverse of a sampling rate of the A/D-conversion of the at least three power levels.

4. A method according to claim 1, wherein the input signal is differentially PSK modulated and the complex signal is calculated based on the at least three power levels.

5. A method according to claim 1, wherein the step of calculating the phase and the amplitude of the complex signal includes calculating calibration coefficients.

6. A method according to claim 1, wherein the step of calculating the phase and the amplitude of the complex signal includes transformation of the complex signal in real (I) and imaginary (Q) parts.

7. A method for receiving a modulated high frequency signal, comprising the steps of:

dividing a modulated high frequency input signal in at least two branches, delaying the at least two branches of the divided input signal relative to one another by a predetermined delay constant;

calculating at least three power levels based on combinations of the delayed at least two branches of the divided input signal; and detecting states of the modulated high frequency input signal by performing an analog comparison decision logic on said at least three power levels.

8. A method according to claim 7, each of the at least two branches of the divided input signal is delayed by a different constant.

9. A method according to claim 7, wherein the step of calculating the at least three power levels is effected by means only of linear passive components.

10. A receiver for high frequency signals, comprising:

a power divider to divide a high frequency input signal in at least two branches, one or more delay lines for delaying the at least two branches relative to one another by a predetermined delay constant;

a calculating circuit for calculating at least three power levels based on combinations of the delayed at least two branches of the divided input signal; and a processing means for calculating the phase and the amplitude of a complex signal representing a relationship between the delayed at least two branches of the divided input signal based on said at least three power levels.

11. A receiver according to claim 10, each of the one or more delay lines has a different delay constant.

12. A receiver according to claim 10, further comprising A/D converters to convert the at least three power levels output by the calculating circuit.

13. A receiver according to claim 12, wherein a delay between the at least two branches of the divided input signal is set equal or greater than an inverse of a sampling rate of the A/D converters.

14. A receiver according to claim 10, wherein the input signal is a differentially PSK modulated signal and the processing means is an analog processing means.

15. A receiver according to claim 10, wherein the calculation circuit comprises only linear passive components.

16. A receiver according to claim 10, wherein the one or more delay lines and the calculating circuit (7,8) are integrated on one chip.

17. A receiver according to claim 10, further comprising at least one digital filter provided between a A/D converter and the processing means.

18. A mobile communications device, wherein the device comprises a receiver according to claim 10.

19. A mobile communications device according to claim 18, wherein the device is a cellular telephone.

20. A mobile communications device according to claim 18, wherein the device is a satellite receiver.

21. A mobile communications device according to claim 18, wherein the device is a receiver for microwave distributions systems.

* * * * *